United States Patent
Lee

(10) Patent No.: US 7,951,690 B2
(45) Date of Patent: May 31, 2011

(54) IMAGE SENSOR AND METHOD FOR MANUFACTURING THE SAME

(75) Inventor: Sang Uk Lee, Chungbuk (KR)

(73) Assignee: Dongbu HiTek Co., Ltd., Seoul (KR)

( * ) Notice: Subject to any disclaimer, the term of this patent is extended or adjusted under 35 U.S.C. 154(b) by 166 days.

(21) Appl. No.: 12/338,437

(22) Filed: Dec. 18, 2008

(65) Prior Publication Data

US 2009/0160005 A1 Jun. 25, 2009

(30) Foreign Application Priority Data

Dec. 21, 2007 (KR) .................. 10-2007-0135889

(51) Int. Cl.
*H01L 21/30* (2006.01)
(52) U.S. Cl. .................. 438/458; 257/E21.568
(58) Field of Classification Search .............. 438/458; 257/E21.568
See application file for complete search history.

(56) References Cited

U.S. PATENT DOCUMENTS

| 7,452,745 | B2 | 11/2008 | Dupont et al. | |
|---|---|---|---|---|
| 2002/0081753 | A1* | 6/2002 | Gates et al. | 438/3 |
| 2002/0142562 | A1* | 10/2002 | Chan et al. | 438/406 |
| 2003/0186521 | A1* | 10/2003 | Kub et al. | 438/558 |
| 2006/0083280 | A1* | 4/2006 | Tauzin et al. | 372/46.01 |
| 2007/0018266 | A1* | 1/2007 | Dupont et al. | 257/440 |
| 2007/0292773 | A1* | 12/2007 | Kim et al. | 430/5 |

FOREIGN PATENT DOCUMENTS

KR 20060120260 A 11/2006

* cited by examiner

*Primary Examiner* — A. Sefer
*Assistant Examiner* — Allen L Parker
(74) *Attorney, Agent, or Firm* — The Law Offices of Andrew D. Fortney; Andrew D. Fortney; Anthony R. Jimenez

(57) ABSTRACT

An image sensor includes circuitry, a metal interconnection, a first substrate, a metal ion-implanted insulating layer, and a photodiode. The circuitry is formed on and/or over the first substrate, and the metal ion-implanted insulating layer is formed on and/or over the metal interconnection. The photodiode is formed in a crystalline semiconductor layer over the metal ion-implanted insulating layer.

9 Claims, 4 Drawing Sheets

US 7,951,690 B2

IMAGE SENSOR AND METHOD FOR MANUFACTURING THE SAME

The present application claims priority under 35 U.S.C. §119 to Korean Patent Application No. 10-2007-0135889 (filed Dec. 21, 2007), which is hereby incorporated by reference in its entirety.

BACKGROUND

An image sensor is a semiconductor device for converting an optical image into an electric signal. The image sensor may be roughly classified into a charge coupled device (CCD) image sensor and a complementary metal oxide silicon (CMOS) image sensor (CIS).

A CIS generally includes a photodiode and at least one MOS transistor formed in a unit pixel, and obtains an image by sequentially detecting electrical signals of unit pixels in a switching manner.

In a related art CIS structure, a photodiode and a transistor are horizontally arranged.

Although the related art horizontal-type CIS has solved many limitations of CCD image sensors, the horizontal-type CIS still has several problems.

First, the horizontal-type CIS of the related art typically has a photodiode and a transistor that are horizontally formed adjacent to each other on a substrate. Therefore, an additional region for forming the photodiode is required, which may decrease the fill factor and limit the possibility of resolution.

Also, in the horizontal-type CIS of the related art, it is generally very difficult to achieve an optimized process of concurrently forming the photodiode and the transistor.

SUMMARY OF THE INVENTION

Embodiments of the present invention relate to an image sensor and a manufacturing method thereof that provide a new integration of circuitry and a photodiode.

Such embodiments may simultaneously improve the resolution and sensitivity of the image sensor.

Some embodiments relate to an image sensor and a manufacturing method thereof that employ a vertical type photodiode to enhance both physical and electrical contact between the vertical type photodiode and a circuitry of the image sensor.

Other embodiments relate to an image sensor and a manufacturing method thereof that employ a vertical type photodiode that may prevent generation of defects that might otherwise occur in a vertical-type photodiode.

Embodiments relate to an image sensor that may include at least one of the following: a first substrate, circuitry including a metal interconnection over the first substrate; a metal ion-implanted insulating layer over the metal interconnection; and a photodiode comprising a crystalline semiconductor layer over the metal ion-implanted insulating layer.

Embodiments further relate to a method for manufacturing an image sensor that may include at least one of the following steps: forming circuitry including a metal interconnection over a first substrate; forming a photodiode over a second substrate; forming a metal ion-implanted insulating layer over the photodiode; bonding the second substrate to the first substrate such that the metal interconnection contacts the metal ion-implanted insulating layer; exposing the photodiode by removing a lower portion of the second substrate; and patterning the photodiode and the metal ion-implanted insulating layer into separate pixels by selectively removing portions of the photodiode and the metal ion-implanted insulating layer.

DESCRIPTION

An image sensor and a method for manufacturing an image sensor in accordance with embodiments of the invention will be described in detail with reference to the accompanying drawings.

Figure 1:
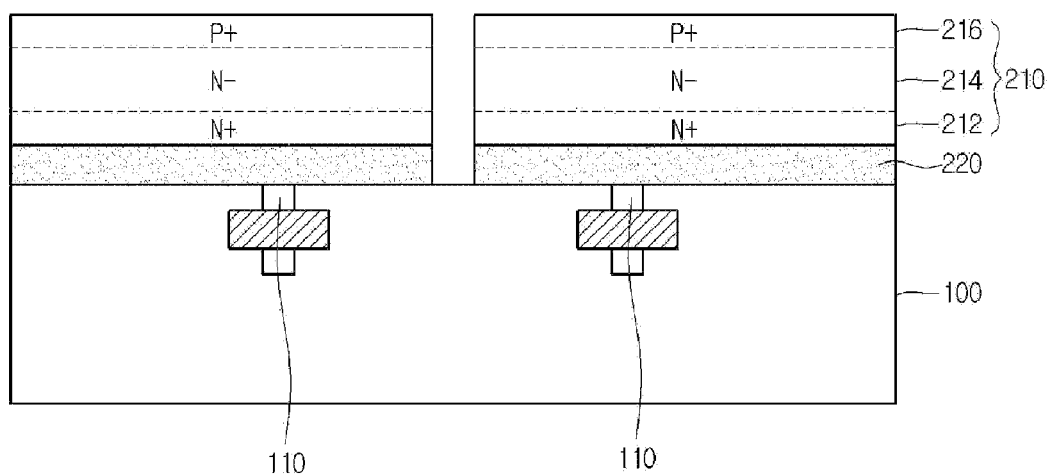
FIG. 1 illustrates an image sensor in accordance with an exemplary embodiment of the present invention.

FIG. 1 is a sectional view of an exemplary image sensor in accordance with embodiments of the invention.

As illustrated in example FIG. 1, an image sensor in accordance with some embodiments may include: a first substrate 100 having circuitry (not shown) including metal interconnection 110 thereon and/or thereover; metal ion-implanted insulating layer 220 on and/or over metal interconnection 110; and a photodiode 210 formed in (e.g., comprising) a crystalline semiconductor layer (see, for example, semiconductor layer 210a in FIG. 3) on and/or over metal ion-implanted insulating layer 220.

Metal ion-implanted insulating layer 220, which is formed by implanting a metal ion into an insulating layer, may have electrical conductivity. For example, the insulator may comprise an oxide layer, and the metal ion may be (but is not limited to) Co ions and/or Ti ions.

Metal ion-implanted insulating layer 220 generally has the same width as photodiode 210. Alternatively, metal ion-implanted insulating layer 220 may have the same width as metal interconnection 110, or any width between that of photodiode 210 and metal interconnection 110.

In certain embodiments, by interposing the metal ion-implanted insulating layer between one substrate over which a photodiode is formed and another substrate over which a circuitry is formed, bonding between those substrates can be enhanced. Also, by forming an ohmic contact between a metal interconnection (e.g., a tungsten plug) functioning as an electrical interconnection and a crystalline semiconductor layer containing a photodiode using a metal ion-implanted insulating layer, a stable image sensor can be provided.

In some embodiments, crystalline semiconductor layer 120a may be (but is not limited to) a single crystalline semiconductor layer. For example, crystalline semiconductor layer 120a may be a polycrystalline semiconductor layer.

Although the circuitry of first substrate 100 is not shown, embodiments may be readily applied to a CIS device having one transistor per unit pixel (a 1 Tr CIS), three transistors per unit pixel (a 3 Tr CIS), five transistors per unit pixel (a 5 Tr CIS), or one and one-half transistors per unit pixel (a 1.5 Tr CIS, or a transistor-sharing CIS, where two or more unit pixels share certain output transistors), as well as a CIS device having four transistors per unit pixel (a 4 Tr CIS).

Also, metal interconnection 110 on and/or over first substrate 100 may include a metallization layer (comprising a plurality of lines or interconnects; not shown) and a plug (adapted to connect adjacent metal layers; not shown). An uppermost portion of metal interconnection 110 can act as a lower electrode of the photodiode.

Next, photodiode 210 may include first conduction type conduction layer 214 in crystalline semiconductor layer 210a (see FIG. 3) and second conduction type conduction layer 216 in crystalline semiconductor layer 210a. For example, photodiode 210 may include, but be not limited to, a low concentration N-type conduction layer 214 in crystalline semiconductor layer 210a, and a high concentration P-type conduction layer 216 in crystalline semiconductor layer 210a on and/or over low concentration N-type conduction layer 214. That is, the first conduction type may be not N-type, but P-type.

In various embodiments, photodiode 210 may further include a high concentration first conduction type conduction layer 212 under the first conduction type conduction layer 214. For example, high concentration first conduction type conduction layer 212 may be an N+ conduction layer, which can contribute to an ohmic contact.

In other embodiments, a top metal layer (not shown) and/or a color filter layer may be further formed on and/or over photodiode 210. In yet further embodiments, each of photodiode 210 and metal ion-implanted insulating layer 220 are separated into unit pixels to thereby prevent crosstalk.

FIGS. 2 through 8 illustrate a method for manufacturing an image sensor in accordance with various embodiments.

Figure 2:
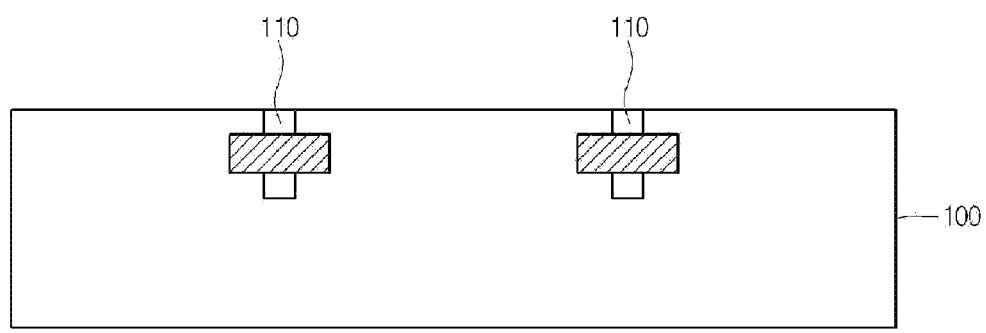
FIGS. 2 through 8 illustrate an exemplary method for manufacturing an image sensor in accordance with embodiments of the present invention.

As illustrated in example FIG. 2, a method for manufacturing such an image sensor may include providing a first substrate 100 on and/or over which metal interconnection 110 and circuitry (not shown) are formed. Although the circuitry on the first substrate 100 is not shown, a CIS in accordance with embodiments can be but is not limited to a 4 Tr CIS. Metal interconnection 110 on and/or over first substrate 100 may include a metal layer (e.g., the hatched horizontal box) and one or more plugs (e.g., the small boxes above and below the hatched horizontal box).

The metal layer may comprise aluminum or an aluminum alloy (e.g., Al with up to 4 wt. % Cu, up to 2 wt. % Ti, and/or up to 1 wt. % Si), deposited by sputtering on a conventional adhesion and/or barrier layers (e.g., Ti and/or TiN, such as a TiN-on-Ti bilayer), and/or covered by conventional adhesion, barrier, hillock suppression, and/or antireflective layers (e.g., Ti, TiN, WN, TiW alloy, or a combination thereof, such as a TiN-on-Ti bilayer or a TiW-on-Ti bilayer). Each plug may comprise tungsten (deposited by chemical vapor deposition [CVD]), on conventional adhesion and/or barrier layers (e.g., Ti and/or TiN, such as a TiN-on-Ti bilayer). The Ti, TiN and TiW layers may be deposited by CVD or sputtering. Alternatively, the metal layer and plug may comprise "dual damascene" copper, formed on conventional adhesive, barrier and/or seed layers (e.g., Ta, TaN and/or Cu, respectively) by electroplating.

The metal layer and plug may be formed on or in a dielectric layer (not shown). The dielectric layer may comprise a lowermost, conformal etch stop layer (e.g., silicon nitride), a conformal buffer and/or gap-fill layer (e.g., silicon-rich oxide [SRO], TEOS [e.g., a silicon oxide formed by CVD from tetraethyl orthosilicate and oxygen], an undoped silicate glass [USG] or a combination thereof), and a bulk dielectric layer (e.g., one or more silicon oxide layers doped with boron and/or phosphorous [BSG, PSG and/or BPSG]). Alternatively, the bulk dielectric layer may comprise a low-k dielectric, such as a fluorosilicate glass (FSG), silicon oxycarbide (SiOC) or hydrogenated silicon oxycarbide (SiOCH), any of which may comprise upper and lower low-k dielectric layers above and below an intermediate etch stop layer (e.g., silicon nitride). The dielectric layer may further comprise a capping layer, e.g., of TEOS, USG, a plasma silane (e.g., silicon dioxide formed by plasma-assisted CVD of silicon dioxide from silane and oxygen), or a combination thereof, such as a bilayer of plasma silane on USG or TEOS, or a bilayer of USG on TEOS.

Figure 3:
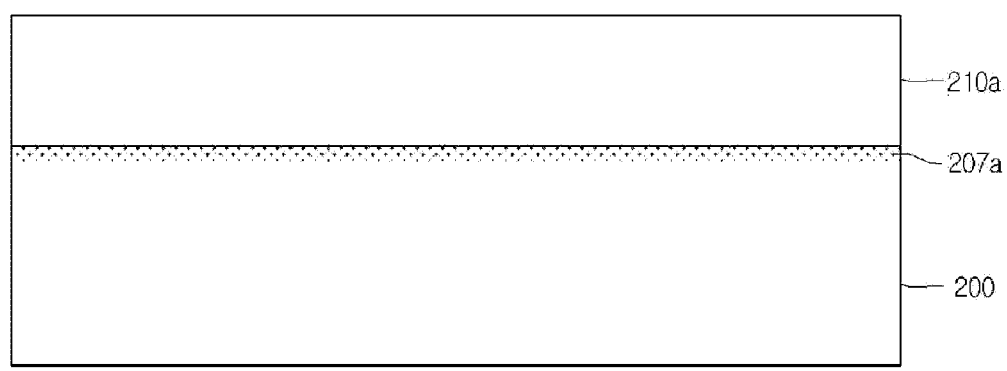

As illustrated in FIG. 3, next, a crystalline semiconductor layer 210a is formed on and/or over a second substrate 200. Since photodiode 210 is formed in the crystalline semiconductor layer 210a, a defect inside the photodiode can be prevented.

For example, crystalline semiconductor layer 210a is formed on second substrate 200 by an epitaxial growth method. After that, hydrogen ions are implanted into an interface between second substrate 200 and crystalline semiconductor layer 210a to form hydrogen ion-implanted layer 207a. The implanting of hydrogen ions may be performed after implanting impurity ions for the formation of photodiode 210.

Figure 4:
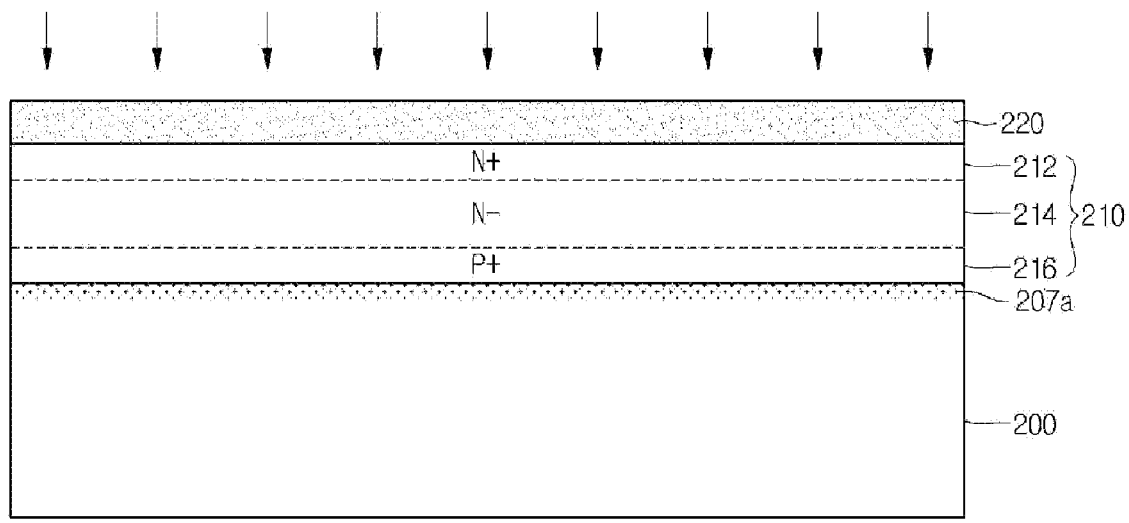

As illustrated in FIG. 4, next, impurity ions are implanted into crystalline semiconductor 210a to form a bulk photodiode 210. For example, a conduction layer 216 having a second conduction type is formed in the crystalline semiconductor layer 210a at or near an interface with the second substrate 200. Second conduction type conduction layer 216 can be a high concentration P-type conduction layer. For example, high concentration P-type conduction layer 216 may be formed by performing a first blanket-ion implantation into the entire surface of second substrate 200 without a mask. For example, second conduction type conduction layer 216 can be formed at a junction depth of less than about 0.5 μm.

After that, conduction layer 214 having a first conduction type is formed on and/or over conduction layer 216 by performing a second blanket-ion implantation into the entire surface of second substrate 200 without a mask. First conduction type conduction layer 214 can be a low concentration N-type conduction layer. The low concentration first conduction type conduction layer 214 can be formed at a junction depth ranging from about 1.0 μm to about 2.0 μm.

As illustrated in FIG. 4, embodiments may further include forming a conduction layer 212 having a relatively high concentration of first conduction type impurities on and/or over first conduction type conduction layer 214. High concentration first conduction type conduction layer 212 can be a high concentration N+conduction layer. For example, N+ conduction layer 212 can be formed on and/or over first conduction type conduction layer 214 by performing a third blanket-ion implantation into the entire surface of second substrate 200 without a mask so that N+ conduction layer 212 can contribute to an ohmic contact with a subsequently deposited material.

Next, metal ion-implanted insulating layer 220 is formed on and/or over photodiode 210. Metal ion-implanted insulating layer 220 is formed as follows. First, an insulating layer is formed on photodiode 210. The insulating layer may be but is not limited to an oxide layer (e.g., silicon dioxide, aluminum oxide, indium tin oxide, etc.), and may be formed by chemical vapor deposition (CVD, which may be plasma-assisted, plasma-enhanced, or high density plasma [HDP] CVD).

After that, a metal ion is implanted into the insulating layer. Metal for the implantation of metal ion may be but is not limited to Co or Ti. Alternative metals include Ni, Zn, Zr, Hf, Ta, V, Cr, Mo, Sr, Sn, In, mixtures thereof, etc. The implant energy and dose of the metal ion are adjusted to a degree sufficient to generate an electrical leakage in the insulating layer. In certain embodiments, metal ion-implanted insulating layer 220 contacts a top plug of metal interconnection 110 to form ohmic contact with photodiode 210 so that electrons generated in photodiode 210 can be efficiently transferred to electrical circuitry in the first substrate 100 through metal interconnection 110.

In many embodiments, implanting the metal ions into the insulating layer may comprise performing a blanket-metal ion implantation on the entire surface of the insulating layer. The blanket-metal ion implantation may not require a strict alignment process with metal interconnection 110 during a subsequent bonding process.

Alternatively, implanting the metal ions into the insulating layer may be performed by selectively implanting metal ion into the insulating layer with an ion implantation mask (e.g., a photoresist pattern exposing a region corresponding to metal interconnection 110). This ion implantation with a mask may require alignment (e.g., with a strict margin) in a subsequent bonding process.

Figure 5:
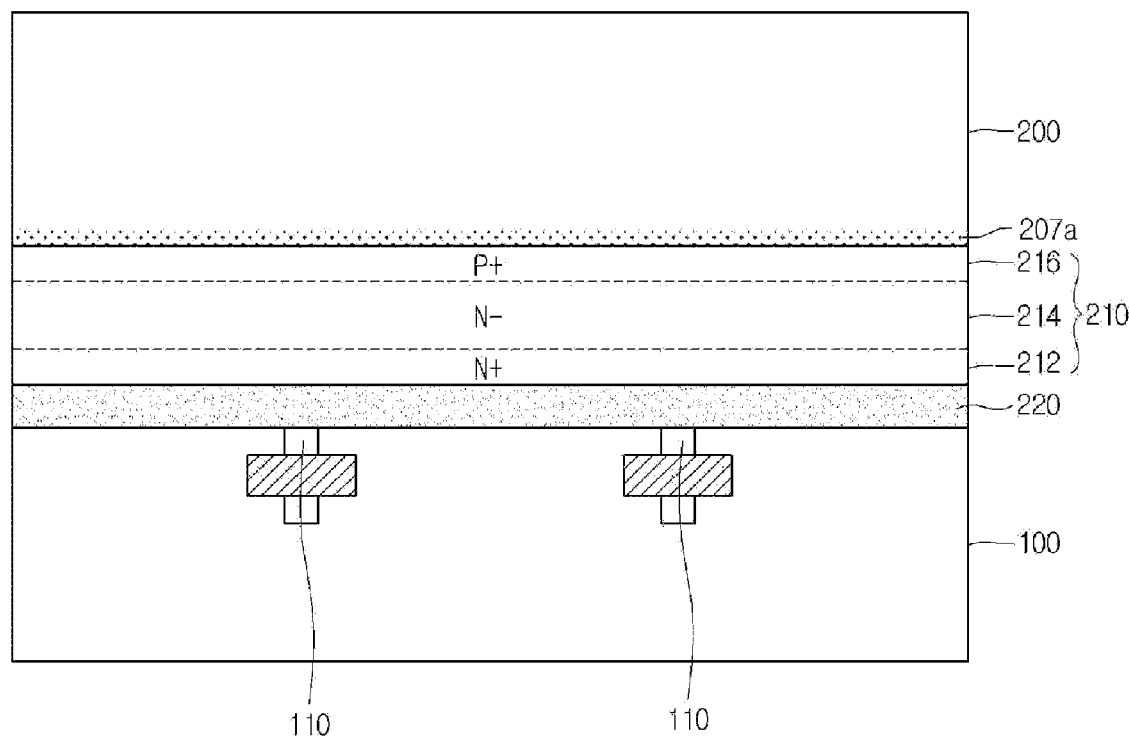

As illustrated in FIG. 5, next, first substrate 100 and second substrate 200 are bonded to each other such that metal ion-implanted insulating layer 220 contacts metal interconnection 110. For example, the bonding may be performed by contacting first substrate 100 and second substrate 200 to each other and then performing activation by plasma to increase a surface energy in the bonding surface (or vice versa; e.g., activating the bonding surface of first substrate 100 and/or second substrate 200 to increase its surface energy by physical [Ar+ ion] and/or chemical [e.g., H+, NH3, N2, SiH4, or other reducing or chemical activating reagent] plasma treatment, then contacting the substrates to each other, and bonding them by, e.g., under a pressure of 2-1000 Pa, preferably 3-100 Pa to opposite surfaces of the substrates, optionally while heating at a temperature of 30-150° C.).

Figure 6:
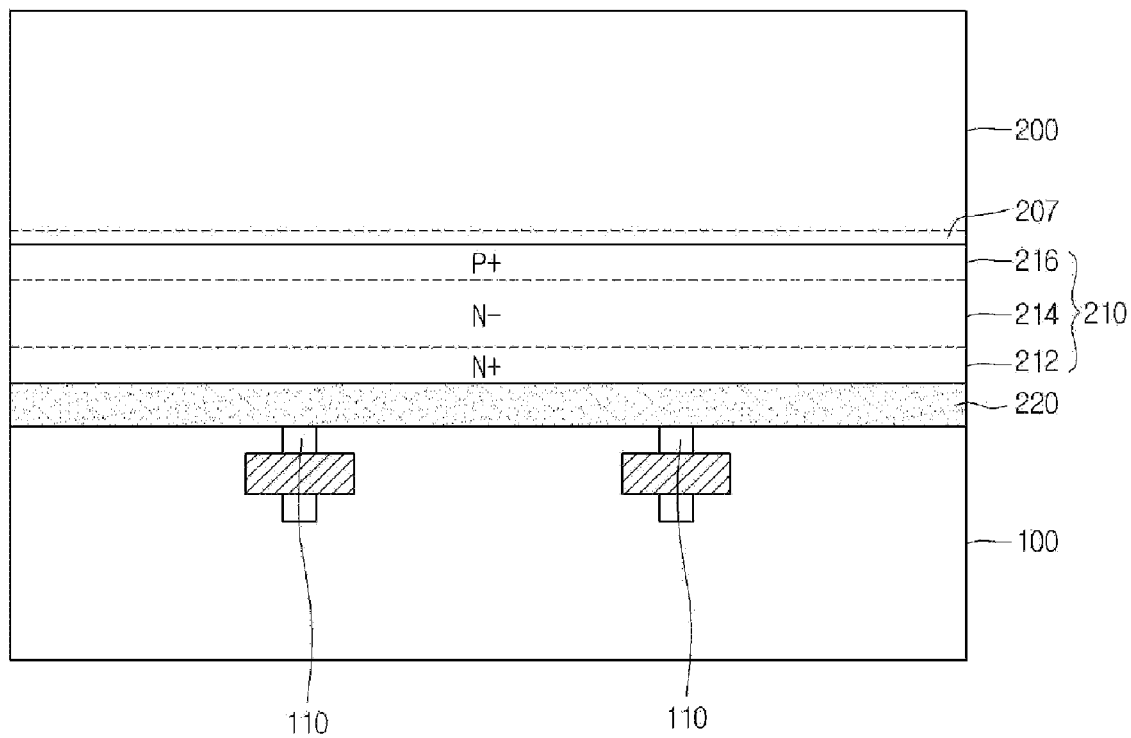

As illustrated in FIG. 6, after that, hydrogen ion implantation layer 220 as formed in second substrate 200 can be changed into hydrogen gas-containing layer 207 by performing heat treatment on second substrate 200, as is known in the art.

Figure 7:
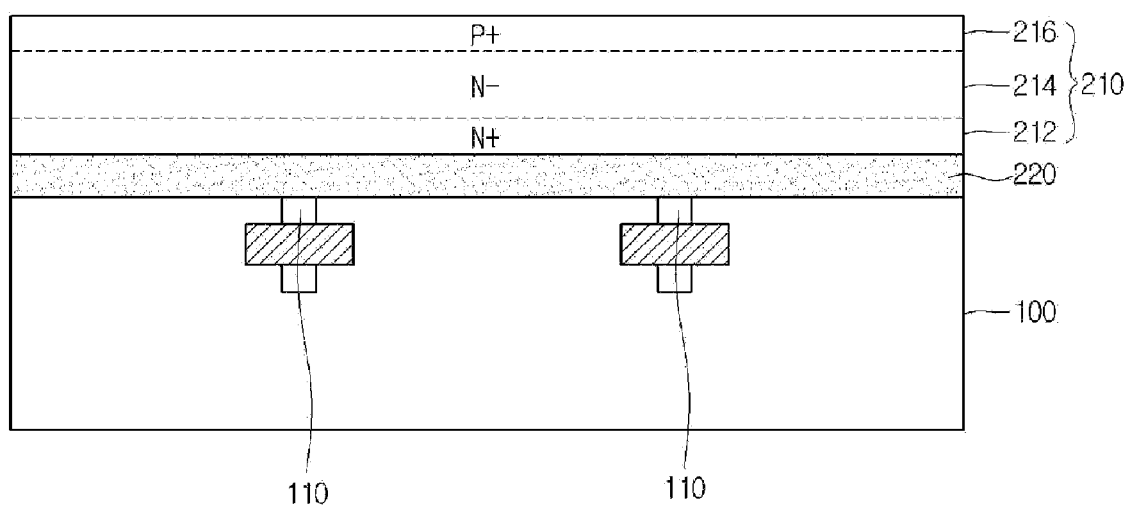

As illustrated in FIG. 7, next, all or a portion of second substrate 200 can then be removed, with photodiode 210 remaining (i.e. the layers under the hydrogen gas-containing layer 207 in FIG. 6) so that photodiode 210 can be exposed. The removal of second substrate 200 can also be performed or can further comprise using a cutting apparatus such as a blade.

Figure 8:
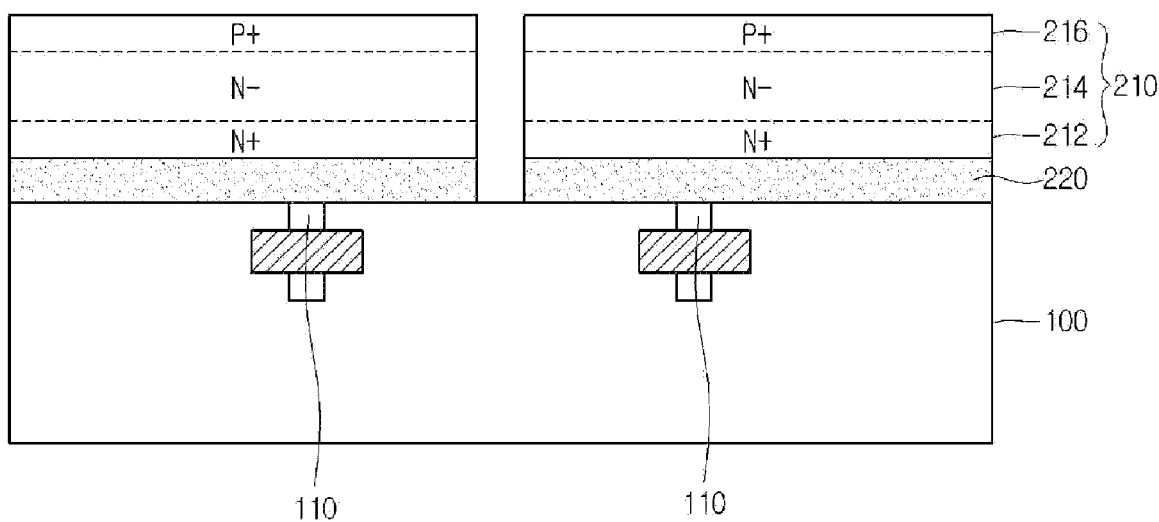

As illustrated in FIG. 8, an etching process separating or patterning photodiode 210 and metal ion-implanted insulating layer 220 into a plurality of unit pixels can then be performed. The etched portion can then be filled with an inter-pixel dielectric (e.g., silicon dioxide, silicon nitride, a transparent or light-blocking resist, etc.). The patterned metal ion-implanted insulating layer 220 may have the same width and/or length as photodiode 210.

Meanwhile, in the case where the metal ion is implanted into only a portion of the insulating layer corresponding to metal interconnection 110, the photodiode 210 must still be patterned to form each unit pixel, but it is not necessary to remove any part of metal ion-implanted insulating layer 220. This is because the metal ion-implanted portion of the insulating layer has a width the same as or slightly larger than the metal interconnection, but the remaining portion of the insulating layer is still an insulating layer, which needs not to be removed.

After that, processes for forming an upper electrode (not shown), a color filter (not shown), and a microlens (not shown) can be performed.

The method for manufacturing an image sensor in accordance with embodiments of the present invention can provide vertical integration of circuitry and photodiodes. Also, the present method for manufacturing an image sensor can prevent defects in the photodiode by employing a vertical type photodiode in which a photodiode is positioned on and/or over a circuitry, and is formed in a crystalline semiconductor layer.

Furthermore, the present method for manufacturing an image sensor can enhance the bonding force between a substrate over or on which a photodiode is formed and a substrate over or on which circuitry is formed by interposing a metal ion-implanted insulating layer between those two substrates.

Furthermore, according to various embodiments, the vertical integration of the circuitry and the photodiode makes it possible to obtain a fill factor close to 100%, and makes it possible to provide a sensitivity higher than that in the related art.

Moreover, according to certain embodiments, the manufacturing cost for obtaining a selected or predetermined resolution can be reduced compared with that in the related art. Also, each unit pixel can implement more complicated circuitry without decreasing the sensitivity.

Although embodiments relate generally to a complementary metal oxide semiconductor (CMOS) image sensor, such embodiments are not limited to the same and may be readily applied to any image sensor employing a photodiode.

Although various embodiments have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
    forming circuitry including a metal interconnection on or over a first substrate;
    forming a photodiode on or over a second substrate;
    forming an insulating layer over the photodiode;
    implanting metal ions into the insulating layer;
    bonding the second substrate to the first substrate, after implanting the metal ions, such that the metal interconnection contacts the insulating layer;
    exposing the photodiode by removing the second substrate; and
    patterning the photodiode and the insulating layer to form a plurality of pixels by selectively removing portions of the photodiode and the insulating layer;
    wherein the metal ions are implanted at an energy and dose sufficient to generate an electrical leakage in the insulating layer such that electrons can be transferred through the insulating layer from the photodiode to the metal interconnection.

2. The method of claim 1, wherein the insulating layer has electrical conductivity.

3. The method of claim 2, wherein the insulating layer comprises an oxide layer.

4. The method of claim 3, wherein implanting the metal ions into the insulating layer comprises blanket-ion implanting the metal ions into an entire surface of the insulating layer without a mask.

5. The method of claim 4, wherein the metal ions comprise Co or Ti.

6. The method of claim 1, wherein the insulating layer comprises an oxide layer.

7. The method of claim 1, wherein the metal ions comprise Co or Ti.

8. The method of claim 7, wherein implanting the metal ions into the insulating layer comprises blanket-ion implanting the metal ions into an entire surface of the insulating layer without a mask.

9. The method of claim 1, wherein implanting the metal ions into the insulating layer comprises blanket-ion implanting the metal ions into an entire surface of the insulating layer without a mask.

* * * * *